(12) United States Patent
Sugita et al.

(10) Patent No.: US 10,827,611 B2
(45) Date of Patent: Nov. 3, 2020

(54) FLEXIBLE WIRING BOARD, ELECTRONIC DEVICE, AND FIBER PRODUCT

(71) Applicant: PANASONIC INTELLECTUAL PROPERTY MANAGEMENT CO., LTD, Osaka (JP)

(72) Inventors: Kazushige Sugita, Hyogo (JP); Masahito Yoshida, Osaka (JP); Tatsuya Taniwaki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/820,095

(22) Filed: Nov. 21, 2017

(65) Prior Publication Data

US 2018/0153033 A1    May 31, 2018

(30) Foreign Application Priority Data

Nov. 28, 2016    (JP) .................................. 2016-230708

(51) Int. Cl.
| | |
|---|---|
| H05K 1/03 | (2006.01) |
| H05K 3/10 | (2006.01) |
| D02G 3/12 | (2006.01) |
| D02G 3/44 | (2006.01) |
| D03D 1/00 | (2006.01) |
| D03D 15/00 | (2006.01) |
| D03D 15/02 | (2006.01) |
| H05K 1/18 | (2006.01) |

(Continued)

(52) U.S. Cl.
CPC ............... *H05K 1/038* (2013.01); *D02G 3/12* (2013.01); *D02G 3/441* (2013.01); *D03D 1/0082* (2013.01); *D03D 1/0088* (2013.01); *D03D 15/0033* (2013.01); *D03D 15/02* (2013.01); *H05K 1/18* (2013.01); *H05K 3/103* (2013.01); *A41D 1/005* (2013.01); *D10B 2401/16* (2013.01); *D10B 2401/18* (2013.01); *H05K 1/028* (2013.01); *H05K 1/189* (2013.01); *H05K 2201/10106* (2013.01)

(58) Field of Classification Search
CPC .......... H05K 1/18; H05K 1/028; H05K 1/038; D03D 1/0082; D03D 1/0088; D03D 15/0033; D03D 15/02; D03D 15/015
See application file for complete search history.

(56) References Cited

U.S. PATENT DOCUMENTS

| | | | | |
|---|---|---|---|---|
| 3,414,666 A | * | 12/1968 | Doundoulakis | ........ H01B 7/083 174/117 M |
| 3,699,590 A | * | 10/1972 | Webber | .................. A41B 17/00 361/220 |

(Continued)

FOREIGN PATENT DOCUMENTS

| | | |
|---|---|---|
| JP | 2008-188772 A | 7/2006 |
| JP | 2006-299457 A | 11/2006 |

(Continued)

*Primary Examiner* — Paresh H Paghadal
(74) *Attorney, Agent, or Firm* — McDermott Will & Emery LLP

(57) ABSTRACT

In a flexible wiring board including a woven fabric or a knit fabric, the woven fabric or the knit fabric includes, as yarns constituting the woven fabric or the knit fabric, a conductive yarn and insulative yarns.

18 Claims, 10 Drawing Sheets

(51) Int. Cl.
*A41D 1/00* (2018.01)
*H05K 1/02* (2006.01)

(56) References Cited

U.S. PATENT DOCUMENTS

| | | | | |
|---|---|---|---|---|
| 3,711,627 | A * | 1/1973 | Maringulov | H01B 7/083 139/425 R |
| 4,199,818 | A * | 4/1980 | Danilin | H01B 7/083 365/63 |
| 5,906,004 | A * | 5/1999 | Lebby | A41D 31/00 139/425 R |
| 9,933,908 | B2 * | 4/2018 | Poupyrev | G06F 3/044 |
| 2003/0064646 | A1 * | 4/2003 | Brown | D02G 3/346 442/189 |
| 2003/0224155 | A1 * | 12/2003 | Orth | D03D 15/00 428/223 |
| 2004/0201878 | A1 * | 10/2004 | Agrawal | G02F 1/155 359/266 |
| 2004/0244193 | A1 * | 12/2004 | Jung | H05K 3/363 29/854 |
| 2004/0246915 | A1 * | 12/2004 | Watanabe | H04W 48/20 370/313 |
| 2006/0160450 | A1 * | 7/2006 | Chou | D03D 15/00 442/217 |
| 2006/0254811 | A1 | 11/2006 | Kirstein et al. | |
| 2007/0190881 | A1 * | 8/2007 | Shibaoka | D03D 1/0088 442/228 |
| 2007/0197115 | A1 * | 8/2007 | Eves | D03D 1/0088 442/194 |
| 2009/0025819 | A1 | 1/2009 | Douglas | |
| 2009/0282908 | A1 * | 11/2009 | Homayoun | D03D 1/0088 73/159 |
| 2010/0276497 | A1 * | 11/2010 | Seban | G06K 19/027 235/492 |
| 2011/0130060 | A1 * | 6/2011 | Chung | D02G 3/12 442/189 |
| 2012/0170232 | A1 * | 7/2012 | Bhattacharya | D03D 3/005 361/749 |
| 2015/0315073 | A1 * | 11/2015 | Hamamoto | C03C 25/40 442/104 |
| 2017/0029985 | A1 * | 2/2017 | Tajitsu | D03D 15/00 |
| 2017/0086513 | A1 * | 3/2017 | Maxey | A41D 13/0051 |
| 2017/0283992 | A1 * | 10/2017 | Bauer | D04B 9/14 |
| 2017/0350044 | A1 * | 12/2017 | Sugita | D02G 3/12 |
| 2019/0004635 | A1 * | 1/2019 | Sawyer | H04R 1/1041 |
| 2019/0276955 | A1 | 9/2019 | Douglas | |

FOREIGN PATENT DOCUMENTS

| | | | | |
|---|---|---|---|---|
| JP | 2006-332647 A | 12/2006 | | |
| JP | 2009-527119 A | 7/2009 | | |
| JP | 2010-278132 A | 12/2010 | | |
| JP | 2013-147761 A | 8/2013 | | |
| JP | WO2013039195 A1 * | 3/2015 | | G21F 3/02 |
| JP | 2016-009637 A | 1/2016 | | |
| WO | WO-2017110402 A1 * | 6/2017 | | D03D 25/00 |

* cited by examiner (a)

(b)

(c)

FLEXIBLE WIRING BOARD, ELECTRONIC DEVICE, AND FIBER PRODUCT

CROSS REFERENCE TO RELATED APPLICATION

This application claims the benefit of priority of Japanese Patent Application Number 2016-230708 filed on Nov. 28, 2016, the entire content of which is hereby incorporated by reference.

BACKGROUND

1. Technical Field

The present disclosure relates to a flexible wiring board, and an electronic device and a fiber product including the flexible wiring board.

2. Description of the Related Art

Flexible wiring boards having flexibility are used in various electronic devices. The flexible wiring boards in the electronic devices are used as cables electrically connecting electronic devices or as mounting boards for mounting electronic components.

For example, Patent Literature (PTL) 1 (Japanese Unexamined Patent Application Publication No. 2010-278132) discloses, as an electronic device including a flexible wiring board as a cable, an image display device including a main circuit board, a hard disk drive, and the flexible wiring board connecting the main circuit board and the hard disk drive.

Moreover, Patent Literature (PTL) 2 (Japanese Unexamined Patent Application Publication No. 2016-9637) discloses, as an electronic device including a flexible wiring board as a mounting board, a lighting apparatus including the flexible wiring board onto which light-emitting elements are mounted.

SUMMARY

Adding an electronic function such as a light-emitting function and a display function to a fiber product such as a garment including a woven fabric or a knit fabric has been considered. In this case, it is conceivable that a circuit wiring block specifically designed using a flexible wiring board is applied to the fiber product.

Because, however, a conventional flexible printed circuit board has a structure in which conductive foil is bonded onto a base film including polyimide etc., the conventional flexible printed circuit board has certain flexibility but lacks such softness and elasticity as a woven fabric or a knit fabric. In addition, the conventional flexible printed circuit board may break when repeatedly folded. For this reason, when the conventional flexible printed circuit board is included in a fiber product such as a garment, discomfort may be felt about the original function as the fiber product or a desired electronic function may not be served over a long period of time.

The present disclosure has an object to provide a flexible wiring board which is a woven fabric or a knit fabric and yet serves as a wire, and an electronic device and a fabric product which include the flexible wiring board.

In order to achieve the above object, a flexible wiring board according to one aspect of the present disclosure is a flexible wiring board including a woven fabric or a knit fabric, and the woven fabric or the knit fabric includes, as yarns constituting the woven fabric or the knit fabric, a conductive yarn and insulative yarns.

Moreover, an electronic device according to one aspect of the present disclosure includes: the above flexible wiring board; and a power source and an electrical load that are electrically connected via the flexible wiring board, the electrical load operating with power from the power source. The flexible wiring board includes the woven fabric. The conductive yarn comprises two conductive yarns that are parallel and woven as lengthwise yarns or crosswise yarns constituting the woven fabric. The power source and the electrical load are electrically connected by the two conductive yarns.

Furthermore, an electronic device according to another aspect of the present disclosure includes: the above flexible wiring board; and an electronic element electrically connected to the flexible wiring board.

Moreover, a fiber product according to one aspect of the present disclosure is a fiber product including the above flexible wiring board as a cloth, the fiber product including a plurality of light-emitting elements disposed in respective cross points of the conductive yarns crossing each other as the lengthwise yarns and the crosswise yarns. The flexible wiring board includes the woven fabric. The conductive yarns are woven to cross each other as the lengthwise yarns and the crosswise yarns constituting the woven fabric. The plurality of light-emitting elements in the respective cross points are electrically connected to, among the conductive yarns, conductive yarns woven as the lengthwise yarns and conductive yarns woven as the crosswise yarns.

According to the present disclosure, it is possible to achieve a flexible wiring board which is a woven fabric or a knit fabric and yet serves as a wire, and an electronic device and a fabric product which include the flexible wiring board.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENT(S)

Hereinafter, embodiments of the present disclosure will be described with reference to the drawings. Each of the subsequently described embodiments shows a specific example of the present disclosure. Therefore, numerical values, shapes, materials, structural components, the arrangement and connection of the structural components, etc. shown in the following embodiments are mere examples, and are not intended to limit the scope of the present disclosure. Accordingly, among the structural components in the following embodiments, structural components not recited in any one of the independent claims which indicate the broadest concepts of the present disclosure are described as optional structural components.

Furthermore, the figures are schematic diagrams and are not necessarily precise illustrations. Substantially identical components are assigned the same reference signs in the figures, and overlapping description may be omitted or simplified.

Embodiment 1

Figure 1:
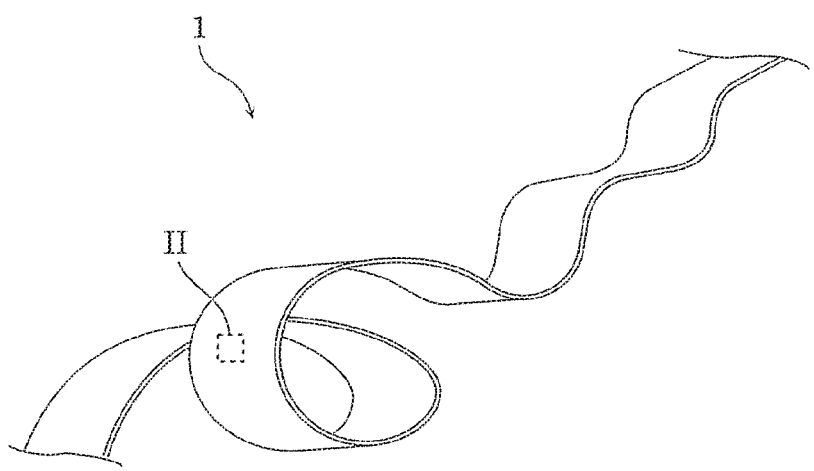
FIG. 1 is a diagram illustrating a schematic configuration of a flexible wiring board according to Embodiment 1.
Figure 2:
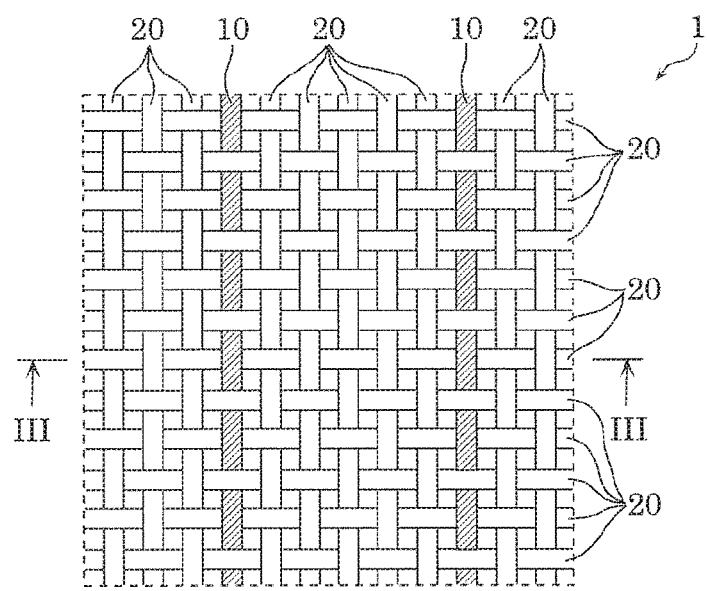
FIG. 2 is a partial enlarged view (enlarged view of region II enclosed by a broken line in FIG. 1) of the flexible wiring board according to Embodiment 1.
Figure 3:
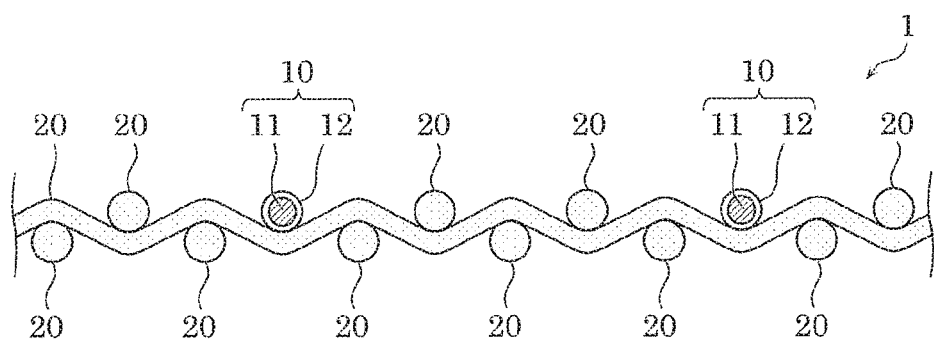
FIG. 3 is a cross-sectional view of the flexible wiring board according to Embodiment 1, taken along line III-III in FIG. 2.

First, a configuration of flexible wiring board 1 according to Embodiment 1 will be described with reference to FIG. 1 to FIG. 3. FIG. 1 is a diagram illustrating a schematic configuration of flexible wiring board 1 according to Embodiment 1. FIG. 2 is a partial enlarged view of flexible wiring board 1 according to Embodiment 1, that is, an enlarged view of region II enclosed by a broken line in FIG. 1. FIG. 3 is a cross-sectional view of flexible wiring board 1, taken along line III-III in FIG. 2. It should be noted that conductive yarns 10 are hatched for the purpose of viewability in FIG. 2.

Flexible wiring board 1 is a sheet or film having a wire that is to be a current path of electrical circuits, and is formed into, for example, a belt as in FIG. 1. Flexible wiring board 1 includes a woven fabric or a knit fabric, and has the same softness and elasticity as a woven fabric or a knit fabric used for a common garment etc.

As illustrated in FIG. 2, flexible wiring board 1 according to Embodiment 1 includes a woven fabric which includes, as yarns (weaving yarns), conductive yarns 10 having conductivity as wire, and insulative yarns 20 having insulation properties. In other words, flexible wiring board 1 including the woven fabric is produced by weaving conductive yarns 10 and insulative yarns 20.

More specifically, flexible wiring board 1 is produced by plain weaving in which lengthwise yarns (warp yarns) and crosswise yarns (weft yarns) are alternately woven. In flexible wiring board 1, insulative yarns 20 are mainly used as most of the lengthwise yarns and crosswise yarns constituting the woven fabric, and conductive yarns 10 are inserted as part of the lengthwise yarns or crosswise yarns.

Conductive yarns 10 can be woven in a pattern when a woven fabric is produced, and are woven as, for example, lengthwise yarns and crosswise yarns constituting a woven fabric. In Embodiment 1, at least two conductive yarns 10 are included as lengthwise yarns constituting the woven fabric. Specifically, the lengthwise yarns constituting the woven fabric include two parallel conductive yarns 10 and insulative yarns 20, while crosswise yarns constituting the woven fabric are only insulative yarns 20.

Conductive yarns 10 each are a pre-insulation wire obtained by coating a conductive thin wire with an insulator, and include, for example, conductive wire 11 to be a core wire, and insulating film 12 coating conductive wire 11 as illustrated in FIG. 3.

Each of conductive wires 11 is a metal wire (metal fiber) including a metal material such as copper, aluminum, and tungsten. Each conductive wire 11 may be a single metal wire or a composite wire made by twisting or paralleling single metal wires.

Conductive wires 11 have a diameter of, for example, at most 1 mm. As an example, conductive wires 11 have a diameter of at most 150 μm, more preferably at most 50 μm, still more preferably at most 20 μm, or still further more preferably at most 10 μm.

In Embodiment 1, conductive wires 11 are only tungsten wires. The tungsten wires comprise, for example, pure tungsten (at a purity greater than 99.00%), but the purity of the tungsten wires is not limited to this. Although metal wires usually become more flexible with the increase in flexibility of the metal wires as a result of making the metal wires thinner, the tungsten wires become flexible when the diameter of the tungsten wires is approximately at most 20 μm. Accordingly, when the tungsten wires are used as conductive wires 11 of conductive yarns 10, setting the diameter of the tungsten wires to be at most 20 μm makes it possible to easily achieve flexible wiring board 1 having softness and elasticity. In Embodiment 1, the tungsten wires having a diameter of 13 μm are used as conductive wires 11.

It should be noted that in view of soldering conductive yarns 10, it is desirable that conductive wires 10 be copper wires instead of the tungsten wires. Specifically, conductive wires 11 may be nickel-plated copper wires.

Moreover, conductive yarns 10 are not limited to a structure in which the entire surface of conductive wire 10 is coated with insulating film 12, and may have a structure in which a false twist yarn including insulating fibers such as natural fibers and chemical fibers is wound around conductive wire 11 as the core wire. In this case also, conductive yarns 10 each are an insulation wire obtained by coating conductive wire 11 with an insulator (false twist yarn).

Insulative yarns 20 may include, as a material, fibers for use in fiber products such as ordinary garments. Insulative yarns 20 may include, for example, natural fibers such as cotton, hemp, silk, and wool, or chemical fibers such as synthetic fibers, recycled fibers, semi-synthetic fibers, and inorganic fibers. Each of insulative yarns 20 may be a single yarn of one type of these fibers or a twist yarn made by twisting two or more types of these fibers together.

Moreover, flexible wiring board 1 includes a woven fabric including, as weaving yarns, only conductive yarns 10 and insulative yarns 20. In this case, it is desirable that a ratio of insulative yarns 20 to all the weaving yarns be higher than a ratio of conductive yarns 10 to all the weaving yarns. With this, it is possible to easily produce flexible wiring board 1 having such softness and elasticity as a woven fabric for use in an ordinary garment.

In view of superior softness and elasticity, insulative yarns 20 may account for at least 50%, more preferably at least 70%, or still more preferably at least 90% of all the weaving yarns. In Embodiment 1, among the weaving yarns, there are only two conductive yarns 10, and the rest are insulative yarns 20. It should be noted that even if the ratio of conductive yarns 10 is higher than the ratio of insulative yarns 20, using conductive yarns 10 including conductive wires 11 having a small diameter makes it possible to provide desired softness and elasticity.

Flexible wiring board 1 thus configured according to Embodiment 1 is used for being included in an electronic device as a cable or mounting board, or in a fiber product.

Next, examples of use of flexible wiring board 1 according to Embodiment 1 will be described with reference to FIG. 4 to FIG. 8. FIG. 4 to FIG. 8 illustrate examples of the first to fifth uses of flexible wiring board 1 according to Embodiment 1.

It is sometimes difficult to identify where conductive yarns 10 are woven in flexible wiring board 1 in which conductive yarns 10 are woven. In other words, it is sometimes impossible to immediately identify the locations of conductive yarns 10 in flexible wiring board 1. As a result, when flexible wiring board 1 is electrically connected to another device, a power source, etc., or when a component is mounted onto flexible wiring board 1, it is necessary to locate conductive yarns 10, thereby potentially requiring time.

Figure 4:
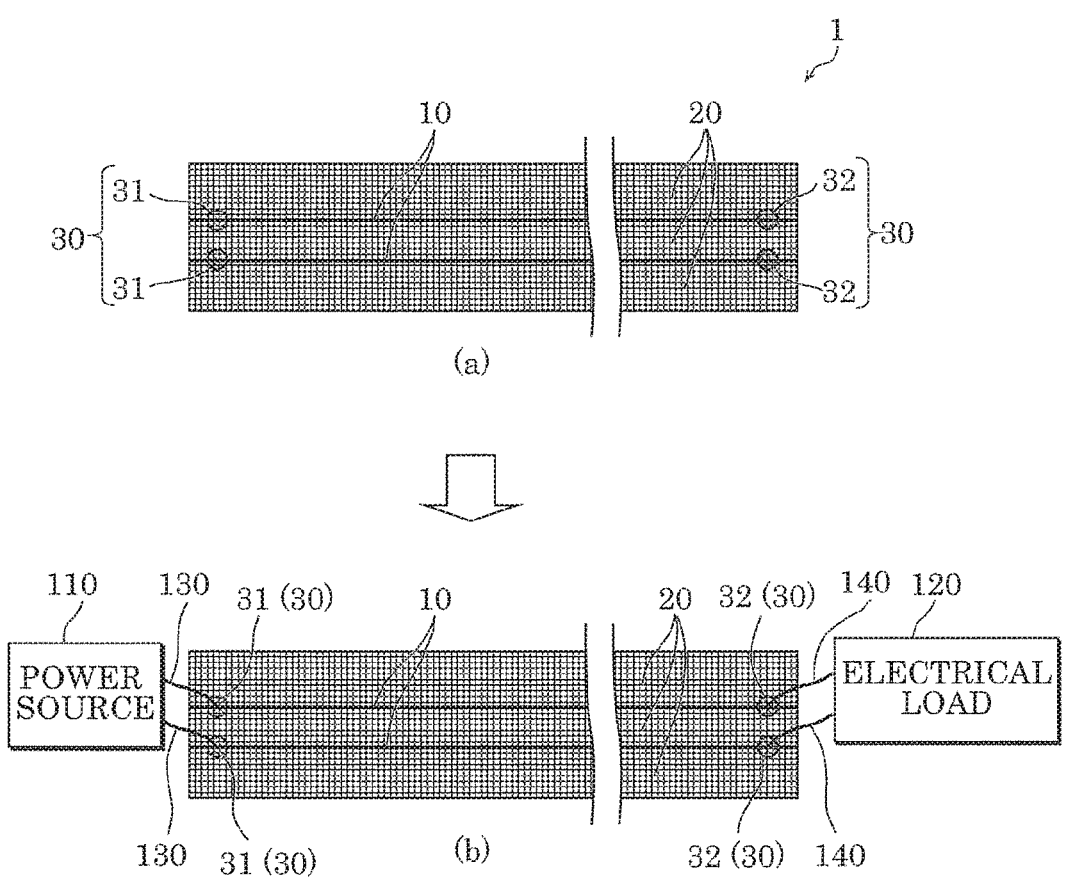
FIG. 4 is a diagram illustrating an example of the first use of the flexible wiring board according to Embodiment 1.

In view of this, as illustrated in (a) of FIG. 4, in order to immediately identify the locations of conductive yarns 10 in flexible wiring board 1 according to Embodiment 1, flexible wiring board 1 is marked with marks 30 indicating the locations of conductive yarns 10. Marks 30 serve as identification marks for identifying conductive yarns 10.

In Embodiment 1, flexible wiring board 1 is marked with marks 30 by causing a color of part of insulative yarns 20 (first insulative yarns) around conductive yarns 10 to be different from a color of another part of insulative yarns 20 (second insulative yarns).

Specifically, as illustrated in (a) of FIG. 4, flexible wiring board 1 is marked with marks 30 by annularly coloring part of insulative yarns 20 (cloth) around conductive yarns 10 so as to cause a color of the part of insulative yarns 20 to be different from a color of another part of insulative yarns 20 (insulative yarns 20 other than those in the circular portions). In other words, marks 30 are portions colored so as to cause the color of the part of insulative yarns 20 around conductive yarns 10 to be different from the color of the other part of insulative yarns 20, and the portions (marks 30) resulting from the coloring overlap with conductive yarns 10.

As an example, marks 30 are disposed adjacent to one end and another end of flexible wiring board 1. Specifically, first marks 31 and second marks 32 are disposed as marks 30 adjacent to the one end and the other end of flexible wiring board 1, respectively.

Moreover, in Embodiment 1, marks 30 are disposed to each of two conductive yarns 10. Specifically, first mark 31 and second mark 32 are disposed adjacent to one end and another end of each of two conductive yarns 10, respectively.

It should be noted that insulative yarns 20 can be colored by, for example, printing a color material such as a pigment and a dye and an adhesive including a binder resin on flexible wiring board 1. Alternatively, insulative yarns 20 may be colored as separate yarns before being woven.

As illustrated in (b) of FIG. 4, electronic device 100 can be configured by electrically connecting power source 110 and electrical load 120 to flexible wiring board 1 thus configured. In other words, power source 110 and electrical load 120 are electrically connected via flexible wiring board 1.

Here, it is possible to easily connect power source 110 and electrical load 120 to two parallel conductive yarns 10 by using marks 30 in flexible wiring board 1.

For example, it is possible to electrically connect power source 110 and flexible wiring board 1 by soldering one ends of pair of lead wires 130 having the other ends connected to power source 110 onto conductive yarns 10 overlapping with marks 30 (first marks 31) adjacent to the one end of flexible wiring board 1.

Likewise, for example, it is possible to electrically connect electrical load 120 and flexible wiring board 1 by soldering one ends of pair of lead wires 140 having the other ends connected to electrical load 120 onto conductive yarns 10 overlapping with marks (second marks 32) adjacent to the other end of flexible wiring board 1.

When conductive yarns 10 and pair of lead wires 130 or pair of lead wires 140 are bonded, conductive wires 11 are exposed by removing insulating films 12 of conductive yarns 10 at marks 30, and exposed conductive wires 11 and pair of lead wires 130 or pair of lead wires 140 are soldered or the like.

With this, it is possible to achieve an electronic device including flexible wiring board 1 as a cable.

It should be noted that power source 110 may be an alternator or direct-current power source, and the selection may be appropriately made depending on the intended use. Moreover, electrical load 120 is, for example, an electronic device of every kind such as a light-emitting module having light-emitting elements like LEDs, a sensor module having detector elements, a communication module, an electronic component like an IC, a driver element like a motor or servo, and a display device like a liquid crystal panel. Electrical load 120 is not particularly limited as long as electrical load 120 operates with power from power source 110.

Furthermore, electrical loads 120 may be connected to flexible wiring board 1. In this case, for example, electrical loads 120 are connected in parallel by two parallel conductive yarns 10.

Figure 5:
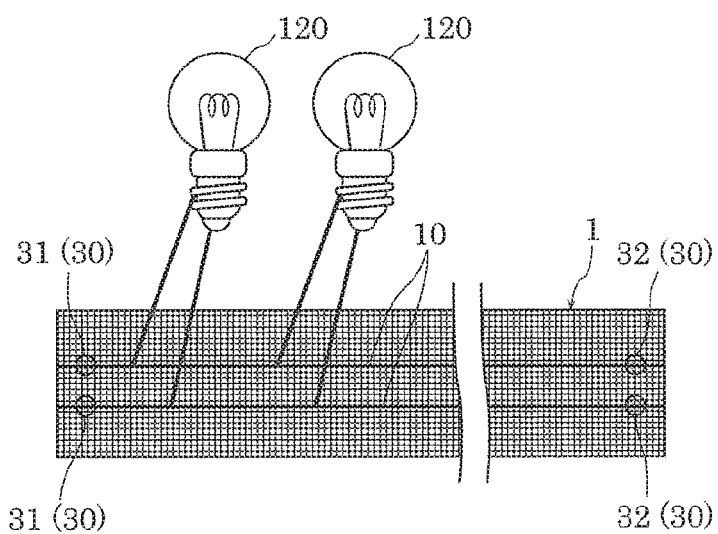
FIG. 5 is a diagram illustrating an example of the second use of the flexible wiring board according to Embodiment 1.
Figure 6:
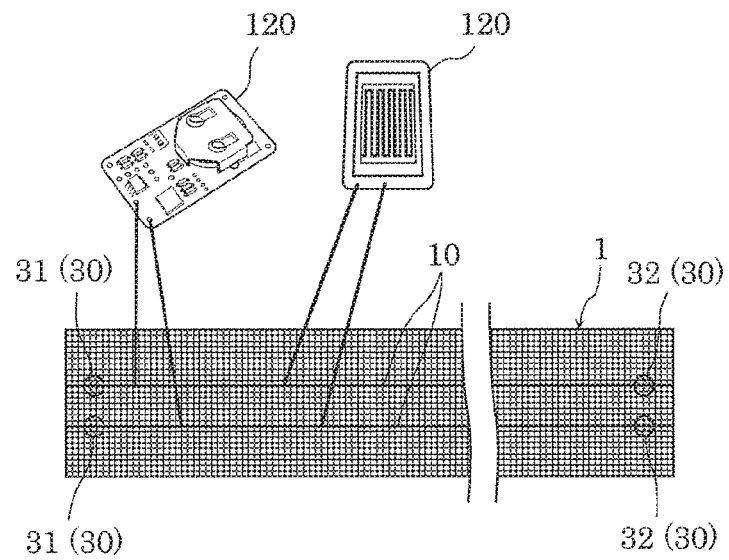
FIG. 6 is a diagram illustrating an example of the third use of the flexible wiring board according to Embodiment 1.

As an example, light-emitting elements may be connected as electrical loads 120 to two conductive yarns 10 at predetermined intervals as illustrated in FIG. 5, or sensors may be connected as electrical loads 120 to two conductive yarns 10 at predetermined intervals as illustrated in FIG. 6.

Although electrical loads 120 may be connected via lead wires to flexible wiring board 1 as illustrated in FIG. 5 and FIG. 6, electrical loads 120 may be directly mounted onto flexible wiring board 1. In other words, flexible wiring board 1 may be used as a mounting board.

Figure 7:
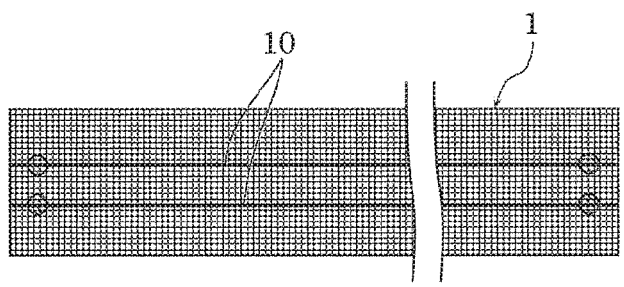
FIG. 7 is a diagram illustrating an example of the fourth use of the flexible wiring board according to Embodiment 1.
Figure 7:
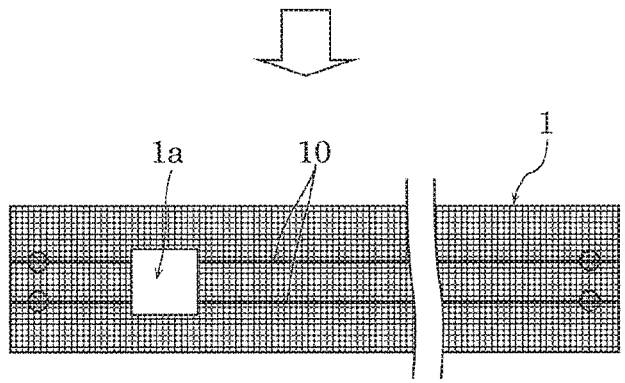
Figure 7:
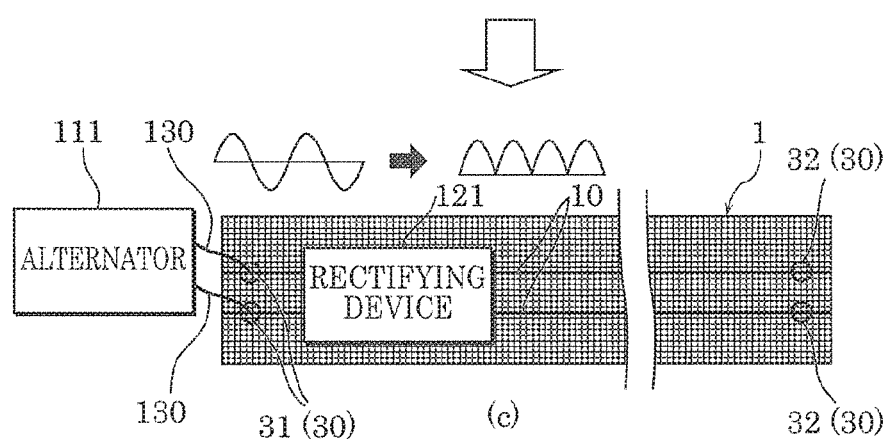

For example, as illustrated in FIG. 7, an electronic component may be mounted as electrical load 120 onto flexible wiring board 1. FIG. 7 illustrates an example in which rectifying device 121 is mounted as an electronic component.

In the example, as illustrated in (a) of FIG. 7, flexible wiring board 1 is prepared first.

Next, as illustrated in (b) of FIG. 7, portions of two conductive yarns 10 at a location in which rectifying device 121 is to be mounted in flexible wiring board 1 are cut away. Specifically, opening 1*a* having a predetermined shape is formed by cutting away a portion of flexible wiring board 1, so as to include the portions of two conductive yarns 10. In (b) of FIG. 7, flexible wiring board 1 is cut away such that rectangular opening 1*a* is formed.

Next, as illustrated in (c) of FIG. 7, rectifying device 121 is fixed in a place in which the portion of flexible wiring board 1 is cut away (a place in which conductive yarns 10 are cut), and four terminals of rectifying device 121 and exposed terminals (four terminals) of two cut conductive yarns 10 are electrically and mechanically connected. Accordingly, it is possible to obtain flexible wiring board 1 onto which rectifying device 121 has been mounted.

As illustrated in (c) of FIG. 7, for example, when rectifying device 121 is configured as a full-wave rectifying circuit in flexible wiring board 1 thus obtained, rectifying device 121 is capable of converting alternating voltage from alternator 111 connected to flexible wiring board 1, to direct voltage through full-wave rectification. As a result, it is possible to supply the direct voltage to an electrical load (not shown) connected to flexible wiring board 1.

It should be noted that although the step of cutting away a portion of flexible wiring board 1 and the step of mounting rectifying device 121 are separate steps in Embodiment 1, these steps may be performed at the same time. For example, two conductive yarns 10 may be cut and at the same time two conductive yarns 10 and rectifying device 121 may be electrically connected by pressing rectifying device 121 into flexible wiring board 1.

Figure 8:
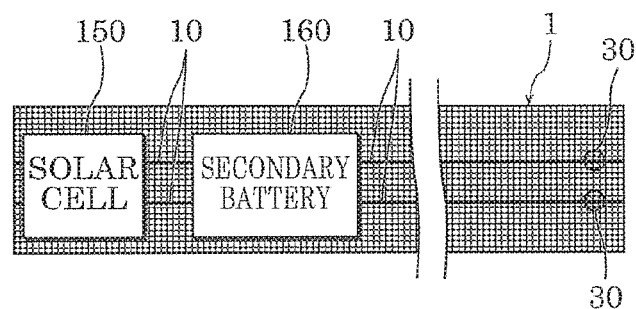
FIG. 8 is a diagram illustrating an example of the fifth use of the flexible wiring board according to Embodiment 1.

Moreover, a circuit element such as rectifying device 121 is used as a component to be mounted onto flexible wiring board 1 in Embodiment 1, the present disclosure is not limited to this. For example, a component to be mounted onto flexible wiring board 1 is not particularly limited as long as the component can be mounted onto flexible wiring board 1. For example, power source 110 and electrical load 120 illustrated in FIG. 4 may be mounted onto flexible wiring board 1 in advance. Moreover, as illustrated in FIG. 8, solar cell 150 and secondary battery 160 may be mounted onto flexible wiring board 1 in advance. Consequently, it is possible to obtain flexible wiring board 1 having a power-generating function and an electricity-storing function.

As described above, flexible wiring board 1 in Embodiment 1 is a flexible wiring board including a woven fabric, and the woven fabric includes, as yarns constituting the woven fabric, conductive yarns 10 and insulative yarns 20.

Accordingly, it is possible to achieve the flexible wiring board having a wire function while being the woven fabric having softness and elasticity. Furthermore, because conductive yarns 10 do not easily break no matter how many times flexible wiring board 1 is repeatedly folded, it is possible to maintain a function as a wiring board over a long period of time.

In addition, because conductive yarns 10 can be woven in a pattern when a woven fabric is produced, it is possible to mount an electronic device, an electronic component, etc. for achieving a function required by a final product (e.g., a fiber product or electronic device), in a latter part of processing according to a plan for the final product, like a wire for a universal wiring board. For example, it is possible to mount an electronic device, an electronic component, etc. for achieving an electronic function such as a light-emitting function, a display function, a sensor function, and a sound function (loudspeaker). In particular, because flexible wiring board 1 having softness and elasticity can be repeatedly and freely folded, flexible wiring board 1 is useful as a base material of a wearable device.

Moreover, in flexible wiring board 1 in Embodiment 1, a color of a first part of insulative yarns 20 around conductive yarn 10 is different from a color of a second part of insulative yarns 20 different from the first part of insulative yarns 20.

With this, because it is possible to easily identify the location of conductive yarn 10, it is possible to easily make an electrical connection between conductive yarn 10 and another component.

Moreover, in flexible wiring board 1 in Embodiment 1, a portion of each of two conductive yarns 10 is cut away, and two conductive yarns 10 that are cut are electrically connected via an electronic component disposed in a place in which the portions of two conductive yarns 10 are cut away.

With this, it is possible to cut any conductive yarn 10 in flexible wiring board 1 to make a wire, and mount an electronic component. Accordingly, when flexible wiring board 1 is used as a mounting board onto which electronic components are mounted, it is possible to achieve a mounting board having a high degree of freedom for the layout of the electronic components.

Moreover, an electronic device in Embodiment 1 includes: flexible wiring board 1; and power source 110 and electrical load 120 that are electrically connected via flexible wiring board 1, electrical load 120 operating with power from power source 110, and power source 110 and electrical load 120 are electrically connected by two conductive yarns 10 that are parallel.

With this, it is possible to achieve an electronic device including flexible wiring board 1 as a cable.

Moreover, in the electronic device in Embodiment 1, electrical load 120 may comprise a plurality of electrical loads 120, and the plurality of electrical loads 120 may be connected in parallel by two conductive yarns 10 that are parallel.

In this manner, it is possible to easily connect the plurality of electrical loads 120 in parallel with two conductive yarns 10 that are parallel, by using flexible wiring board 1.

In this case, the plurality of electrical load 120 may be light-emitting elements.

With this, it is possible to achieve, as an electronic device, a light-emitting device in which the light-emitting elements are connected in parallel by flexible wiring board 1.

Alternatively, the plurality of electrical loads 120 may be sensors.

With this, it is possible to achieve, as an electronic device, a sensor device in which the sensors are connected in parallel by flexible wiring board 1.

Figure 9:
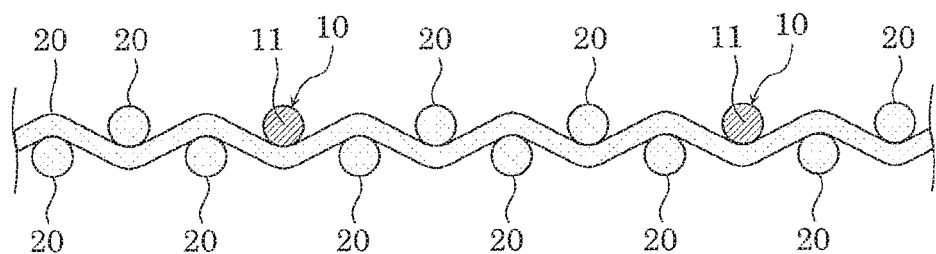
FIG. 9 is a cross-sectional view of a flexible wiring board according to Variation 1 of Embodiment 1.

It should be noted that although conductive yarns 10 include conductive wires 11 and insulating films 12 in Embodiment 1, conductive yarns 10 may include only conductive wires 11 as illustrated in FIG. 9. Specifically, conductive yarns 10 may include conductive wires 11 each having the exposed surface because each conductive wire 11 is not coated with an insulator. In addition, one flexible wiring board may include conductive yarns 10 including conductive wires 11 and insulating films 12, and conductive yarns 10 including only conductive wires 11.

Figure 10:
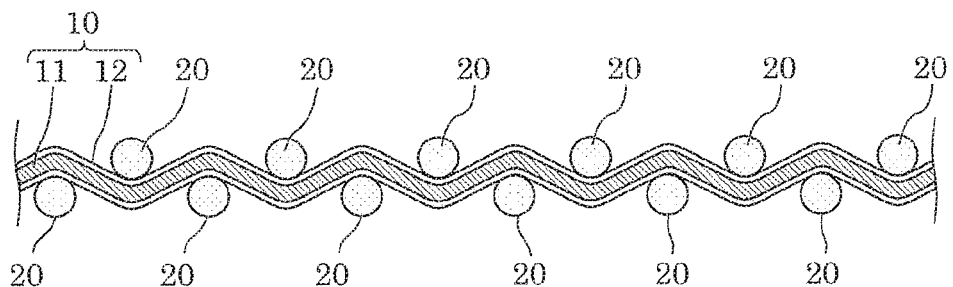
FIG. 10 is a cross-sectional view of a flexible wiring board according to Variation 2 of Embodiment 1.

Moreover, although conductive yarns 10 are woven as the lengthwise yarns into the woven fabric in Embodiment 1, conductive yarns 10 may be woven as crosswise yarns into a woven fabric as illustrated in FIG. 10.

Figure 11:
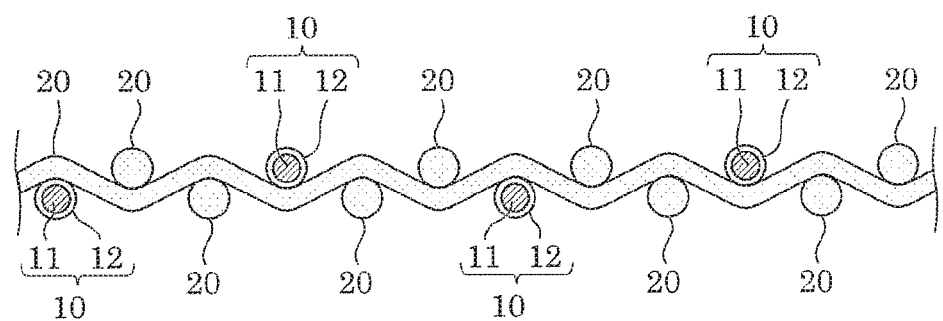
FIG. 11 is a cross-sectional view of a flexible wiring board according to Variation 3 of Embodiment 1.

Furthermore, although conductive yarns 10 are woven above insulative yarns 20, the crosswise yarns, in Embodiment 1, conductive yarns 10 may be woven both above and below insulative yarns 20, the crosswise yarns, as illustrated in FIG. 11. Alternatively, conductive yarns 10 may be woven only below insulative yarns 20, the crosswise yarns.

Embodiment 2

Figure 12:
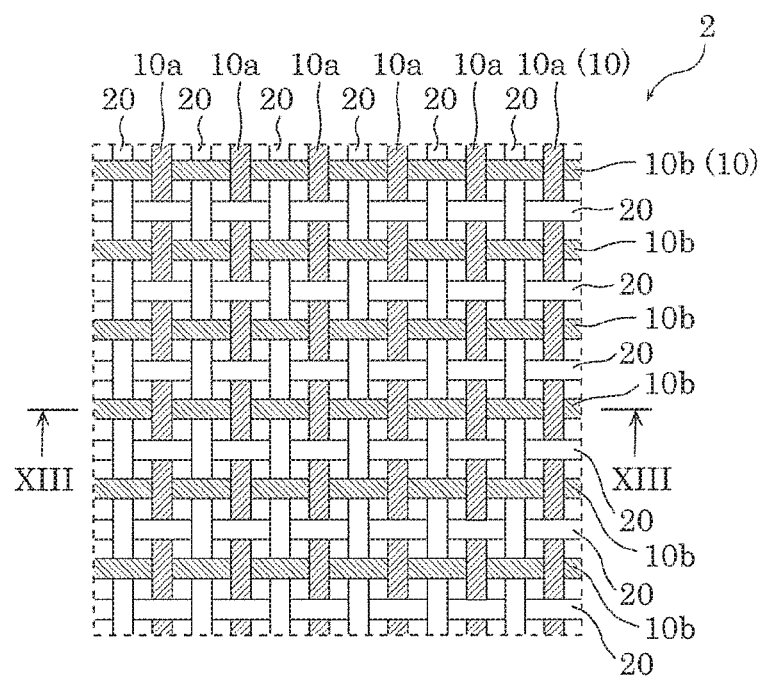
FIG. 12 is a partial enlarged view of a flexible wiring board according to Embodiment 2.
Figure 13:
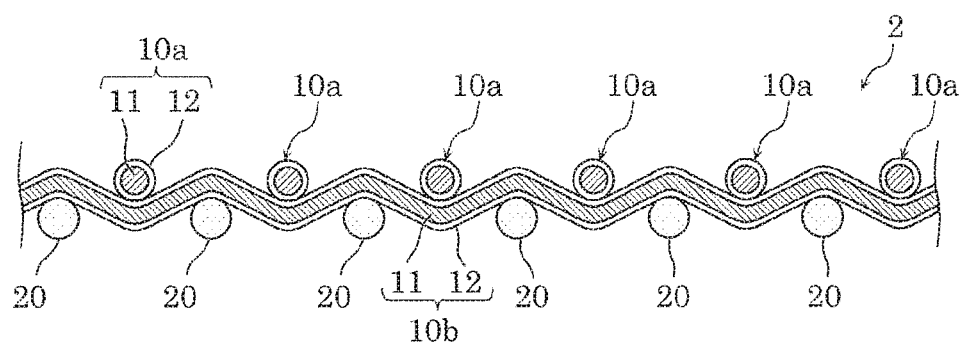
FIG. 13 is a cross-sectional view of the flexible wiring board according to Embodiment 2, taken along line XIII-XIII in FIG. 12.

Next, flexible wiring board 2 according to Embodiment 2 will be described with reference to FIG. 12 and FIG. 13. FIG. 12 is a partial enlarged view of flexible wiring board 2 according to Embodiment 2. FIG. 13 is a cross-sectional view of flexible wiring board 2, taken along line XIII-XIII in FIG. 12. It should be noted that conductive yarns 10 (lengthwise conductive yarns 10a and crosswise conductive yarns 10b) are hatched for the purpose of viewability in FIG. 12.

Flexible wiring board 2 according to Embodiment 2 is a woven fabric like flexible wiring board 1 according to Embodiment 1, but differs from flexible wiring board 1 according to Embodiment 1 in how conductive yarns 10 are used as weaving yarns.

Specifically, whereas conductive yarns 10 are used as only one of the lengthwise yarns and the crosswise yarns in flexible wiring board 1 according to Embodiment 1, as illustrated in FIG. 12 and FIG. 13, conductive yarns 10 are used as both lengthwise yarns and crosswise yarns constituting a woven fabric in flexible wiring board 2 according to Embodiment 2. In other words, conductive yarns 10 are woven as the lengthwise yarns and the crosswise yarns crossing each other in Embodiment 2.

More specifically, both conductive yarns 10 and insulative yarns 20 are used as the lengthwise yarns and the crosswise yarns in Embodiment 2. In other words, flexible wiring board 2 is produced by plain weaving in which the lengthwise yarns and the crosswise yarns are alternately woven, and both conductive yarns 10 and insulative yarns 20 are used as the lengthwise yarns and the crosswise yarns.

Moreover, in Embodiment 2, because lengthwise conductive yarns 10a that are conductive yarns 10 woven as the lengthwise yarns and crosswise conductive yarns 10b that are conductive yarns 10 woven as the crosswise yarns are mutually perpendicular, at least one of lengthwise conductive yarns 10a and crosswise conductive yarns 10b coated with insulators is used such that lengthwise conductive yarns 10a and crosswise conductive yarns 10b are not conducted and short-circuited at cross points 2a in which lengthwise conductive yarns 10a and crosswise conductive yarns 10b are mutually perpendicular. In Embodiment 2, lengthwise conductive yarns 10a and crosswise conductive yarns 10b have the same configuration as conductive yarns 10 in Embodiment 1, and are coated with insulating films 12. It should be noted that desired insulation performance can be obtained by appropriately increasing the thickness of insulating films 12 of lengthwise conductive yarns 10a (crosswise conductive yarns 10b) in accordance with the magnitude of current flowing through lengthwise conductive yarns 10a (crosswise conductive yarns 10b).

Moreover, also in Embodiment 2, although insulative yarns 20 may be caused to account for a larger share of all the weaving yarns than conductive yarns (lengthwise conductive yarns 10a and crosswise conductive yarns 10b), conductive yarns 10 may be caused to account for a larger share of all the weaving yarns. In view of superior softness and elasticity, insulative yarns 20 may account for at least 50%, more preferably at least 70%, or still more preferably at least 90% of all the weaving yarns. It should be noted that each of conductive yarns 10 and each of insulative yarns 20 are alternately woven in a length direction and a crosswise direction in Embodiment 2. Consequently, insulative yarns 20 account for approximately 50% of all the weaving yarns.

It should be noted that although flexible wiring board 2 is formed into a cloth having the long lengthwise and crosswise sides.

Figure 14:
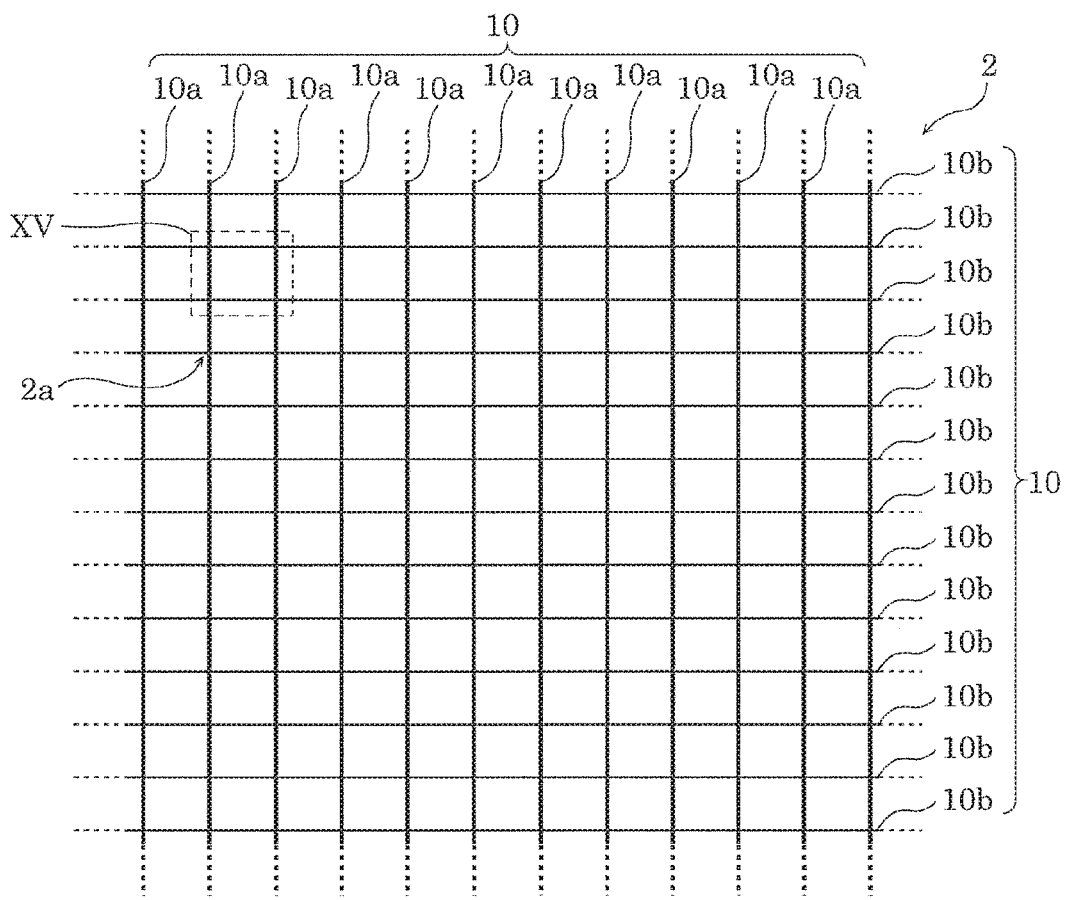
FIG. 14 is a diagram illustrating an electrical circuit that is an example of use of the flexible wiring board according to Embodiment 2.
Figure 15:
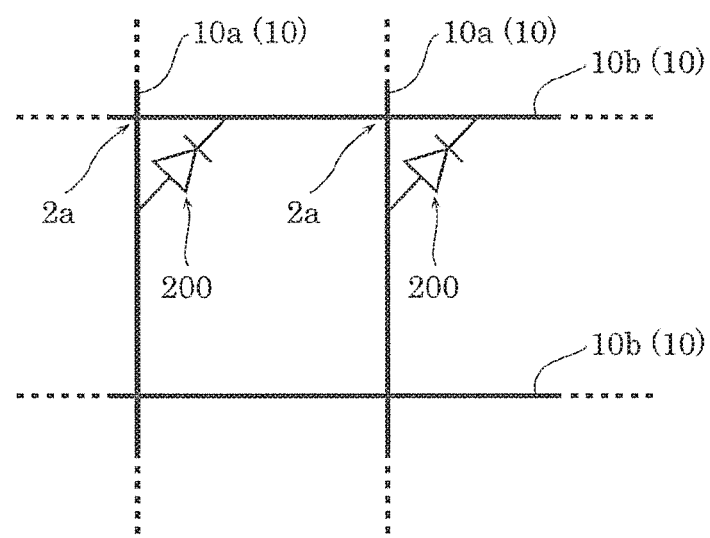
FIG. 15 is a diagram illustrating a pixel configuration of the electrical circuit in FIG. 14.

Hereinafter, examples of use of flexible wiring board 2 according to Embodiment 2 will be described with reference to FIG. 14 and FIG. 15. FIG. 14 is a diagram illustrating an electrical circuit that is an example of use of flexible wiring board 2 according to Embodiment 2. FIG. 15 is a diagram illustrating a pixel configuration of the electrical circuit in FIG. 14, that is, an enlarged view of region XV enclosed by a broken line in FIG. 14. It should be noted that light-emitting elements 200 are omitted from FIG. 14.

As illustrated in FIG. 14 and FIG. 15, in flexible wiring board 2 according to Embodiment 2, light-emitting element 200 is disposed in each of cross points 2a in which lengthwise conductive yarns 10 and crosswise conductive yarns 10b cross each other. In other words, light-emitting elements 200 are disposed in a matrix. Light-emitting element 200 in each cross point 2a is electrically connected to lengthwise conductive yarn 10a and crosswise conductive yarn 10b.

Flexible wiring board 2 thus configured can be used as, for example, a passive matrix driving display device. In this case, by connecting a driver IC or the like to each of lengthwise conductive yarns 10a and each of crosswise conductive yarns 10b and applying voltage in synchronization with timing from two directions of lengthwise conductive yarns 10a and crosswise conductive yarns 10b, it is possible to cause light-emitting elements 200 in cross points 2a to emit light with the timing. In consequence, it is possible to display a desired image by sequentially causing light-emitting elements 200 of target pixels to emit light.

It should be noted that examples of light-emitting elements 200 include light-emitting diodes (LEDs) and solid-state light-emitting elements such as organic electroluminescent (EL) elements.

Moreover, flexible wiring board 2 according to Embodiment 2 has softness and elasticity like a cloth in spite of disposed light-emitting elements 200, and conductive yarns 10 do not easily break no matter how many times flexible wiring board 2 is folded. Accordingly, flexible wiring board 2 onto which light-emitting elements 200 are mounted can be used for part of a fiber product, and the fiber product capable of retaining a display function over a long period of time can be achieved.

Figure 16:
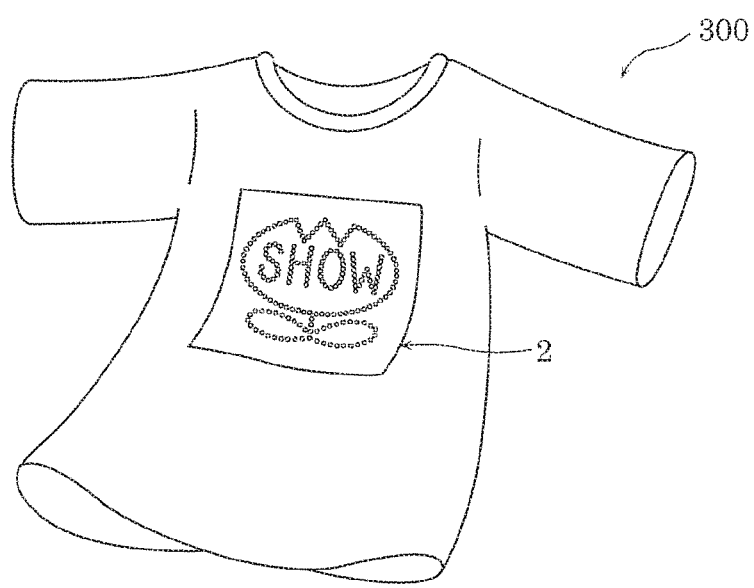
FIG. 16 is a diagram illustrating an example of a fiber product including the flexible wiring board according to Embodiment 2.

For example, as illustrated in FIG. 16, flexible wiring board 2 in which light-emitting elements 200 are disposed in the matrix can be used for T-shirt 300. In this case, it is possible to freely change the pattern of T-shirt 300 by causing light-emitting elements 200 to emit light in a desired manner.

Figure 17:
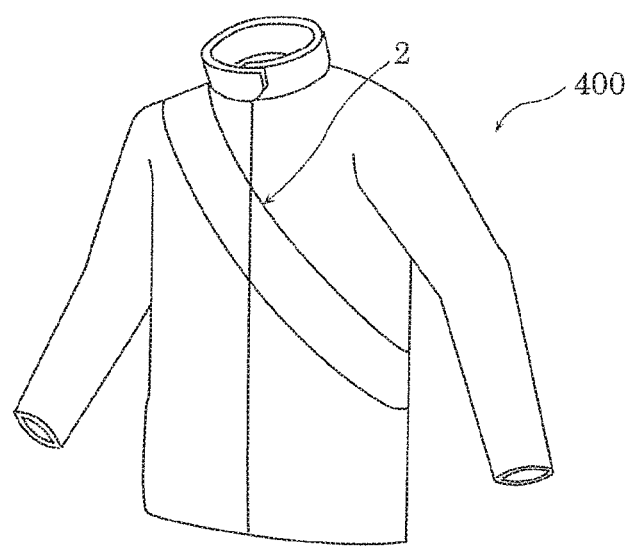
FIG. 17 is a diagram illustrating another example of the fiber product including the flexible wiring board according to Embodiment 2.

Moreover, as illustrated in FIG. 17, flexible wiring board 2 in which light-emitting elements 200 are disposed in the matrix can be used for jacket 400. In this case, instead of a reflective sash for security, jacket 400 for security can be achieved by causing light-emitting elements 200 to emit light in a sash pattern.

As described above, flexible wiring board 2 according to Embodiment 2 is a woven fabric produced by weaving conductive yarns 10 as the lengthwise yarns and the crosswise yarns crossing each other.

Accordingly, like Embodiment 1, it is possible to achieve the flexible wiring board having a wire function while being the woven fabric having softness and elasticity.

Moreover, in Embodiment 2, because conductive yarns 10 are included in both the lengthwise yarns and the crosswise yarns constituting the woven fabric, it is possible to achieve a flexible wiring board having wires in two directions mutually perpendicular. As a result, when flexible wiring board 2 is used as a mounting board, it is possible to further increase a degree of freedom regarding the layout of an electronic component, and flexible wiring board 2 can be applied to an electronic device demanding matrix wires.

Moreover, flexible wiring board 2 can be used as a fiber product. In this case, the fiber product in Embodiment 2 includes flexible wiring board 2, and light-emitting element 200 disposed in each of cross points 2*a* of conductive yarns 10 that cross each other as the lengthwise yarns and the crosswise yarns, and light-emitting element 200 in each cross point 2*a* is electrically connected to conductive yarn 10 (lengthwise conductive yarn 10*a*) woven as the lengthwise yarn and conductive yarn 10 (crosswise conductive yarn 10*b*) woven as the crosswise yarn.

As a result, light-emitting elements 200 are arrayed in a matrix. Thus, light-emitting elements 200 arrayed in the matrix can be used as a display. Accordingly, it is possible to achieve the fiber product having a display function.

Although light-emitting elements 200 are disposed to flexible wiring board 2 in Embodiment 2, components to be disposed to flexible wiring board 2 are not limited to light-emitting elements 200.

Figure 18:
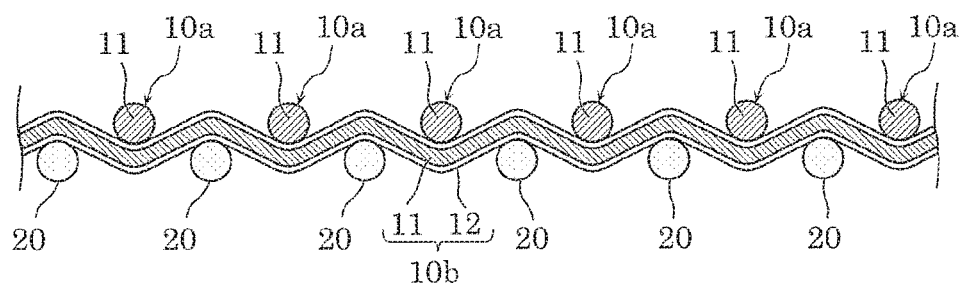
FIG. 18 is a cross-sectional view of a flexible wiring board according to Variation 1 of Embodiment 2.

Moreover, although conductive yarns 10 include conductive wires 11 and insulating films 12 in Embodiment 2, conductive yarns 10 may include only conductive wires 11 as illustrated in FIG. 18 as long as one of the lengthwise yarns and the crosswise yarns is conductive yarns 10 including insulating films 12.

Figure 19:
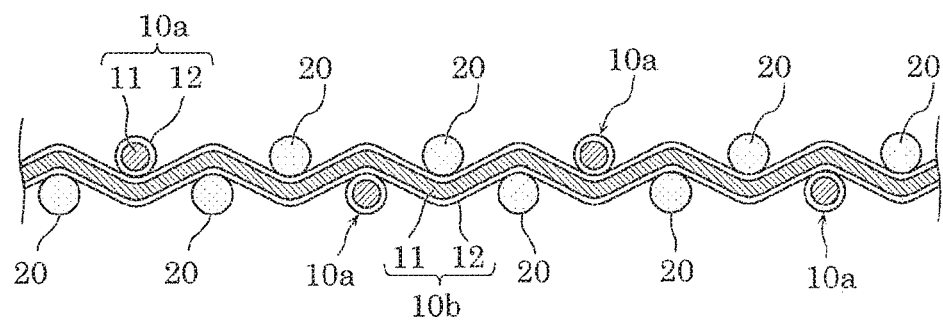
FIG. 19 is a cross-sectional view of a flexible wiring board according to Variation 2 of Embodiment 2.

Furthermore, although conductive yarns 10 are woven above insulative yarns 20, the crosswise yarns, in Embodiment 2, conductive yarns 10 may be woven both above and below insulative yarns 20, the crosswise yarns, as illustrated in FIG. 19. Alternatively, conductive yarns 10 may be woven only below insulative yarns 20, the crosswise yarns.

Variations

Although the flexible wiring board, electronic device, and fiber product according to the present disclosure have been described based on the aforementioned embodiments, the present disclosure is not limited to the aforementioned embodiments.

Figure 20:
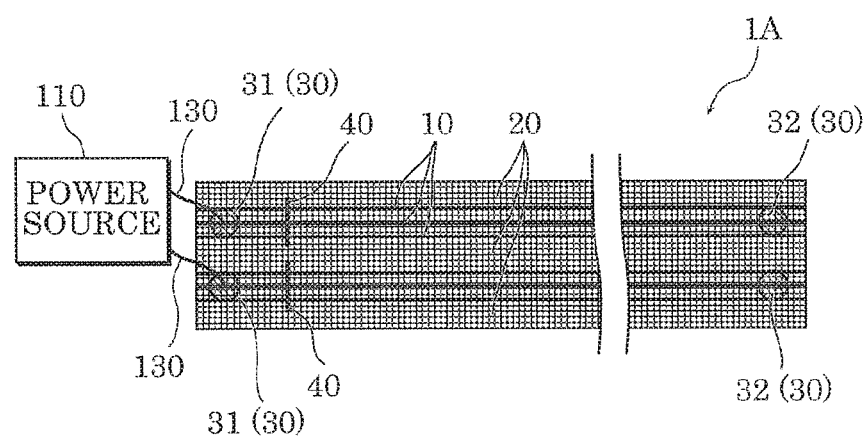
FIG. 20 is a diagram illustrating a configuration of a flexible wiring board according to a variation.

For example, although conductive yarns 10 are woven such that one conductive yarn 10 corresponds to one potential in flexible wiring board 1 according to Embodiment 1, the present disclosure is not limited to this. For example, conductive yarns 10 may be woven such that conductive yarns 10 correspond to one potential. As an example, like flexible wiring board 1A illustrated in FIG. 20, conductive yarns 10 may be woven such that three conductive yarns 10 correspond to one potential. In this case, connecting yarn 40 for electrically connecting three conductive yarns 10 may be woven. Connecting yarn 40 may have, for example, the same configuration as conductive yarns 10.

Moreover, although flexible wiring board 1 is the belt (ribbon) having longer one of the lengthwise sides and the crosswise sides in Embodiment 1, the present disclosure is not limited to this. For example, flexible wiring board 1 may be a cloth having the long lengthwise and crosswise sides like a cloth for garment. In an opposite manner, although flexible wiring board 2 is the cloth having the long lengthwise and crosswise sides, flexible wiring board 2 may be a belt having longer one of the lengthwise sides and the crosswise sides.

Moreover, although, when the electronic device, the fiber product, or the like is achieved using flexible wiring board 1 or 2 in a corresponding one of Embodiments 1 and 2, the power source, the electrical load, or the like is connected to the both ends of conductive yarns 10, the present disclosure is not limited to this. For example, the power source, the electrical load, etc. may be connected to only one ends of conductive yarns 10, and another ends of conductive yarns 10 may be open. In other words, the other ends of conductive yarns 10 may not be connected to the power source, the electrical load, etc., and may be in an open state. In this case, conductive yarns 10 having the other ends that are open may be used as antennas. For example, it is possible to dispose at least three conductive yarns 10, and use one of at least three conductive yarns 10 as an antenna.

Moreover, although, when the electronic device, the fiber product, or the like is achieved using flexible wiring board 1 or 2 in a corresponding one of Embodiments 1 and 2, the electrical load that operates with the power from the power source is connected to flexible wiring board 1 or 2, the present disclosure is not limited to this. For example, the electronic device, the fiber product, or the like may be achieved by connecting, to flexible wiring board 1 or 2, power-generating elements for thermocouple generation, photovoltaic generation, or the like, or electronic elements other than elements that operate with supplied power, like electric storage elements such as batteries. In other words, the present disclosure can be achieved as an electronic device including flexible wiring board 1 and the electronic elements electrically connected to flexible wiring board 1.

Moreover, although flexible wiring boards 1 and 2 including the woven fabric are produced by the plain weaving in Embodiments 1 and 2, the present disclosure is not limited to this. For example, flexible wiring boards 1 and 2 may be produced by diagonal weaving or satin weaving.

Moreover, although flexible wiring boards 1 and 2 are the woven fabrics in Embodiments 1 and 2, the present disclosure is not limited to this. For example, flexible wiring boards 1 and 2 may be knit fabrics. Specifically, a flexible wiring board including a knit fabric includes, as yarns (knitting yarns), conductive yarns 10 for wire and insulative yarns 20. In other words, the flexible wiring board including the knit fabric may be produced by weaving conductive yarns 10 and insulative yarns 20.

Moreover, although flexible wiring boards 1 and 2 are produced by weaving conductive yarns 10 and insulative yarns 20 at the same time in Embodiments 1 and 2, the present disclosure is not limited to this. For example, a woven fabric may be produced by weaving, as yarns, only insulative yarns 20 including natural fibers or chemical fibers, and subsequently insulative yarns 10 may be woven as yarns into the woven fabric.

Moreover, T-shirt 300 and jacket 400 are each described as the fiber product including flexible wiring board 2 in Embodiment 2, the present disclosure is not limited to this. Examples of the fiber product including flexible wiring board 2 may include a garment other than the T-shirt and jacket, a hat, gloves, and socks. It should be noted that these fiber products may include flexible wiring board 1 according to Embodiment 1. In addition, a fiber product including flexible wiring board 1 or 2 is not limited to an object a person wears, and examples of such a fiber product include a tent, a sleeping bag, a bag, and a flag.

Moreover, insulative yarns 20 other than marks 30 may be colored in the fiber product including flexible wiring board 1 or 2. Such coloring may be performed on the whole or part of flexible wiring board 1 or 2.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

What is claimed is:

1. A flexible wiring board including a woven fabric or a knit fabric,
wherein the woven fabric or the knit fabric includes, as yarns constituting the woven fabric or the knit fabric, a conductive yarn and insulative yarns,
the conductive yarn includes a conductive wire including a tungsten wire having a diameter of at most 20 μm,
the conductive yarn comprises the conductive wire and a false twist yarn including an insulating fiber wound around the conductive wire,
the conductive wire is a pre-insulation wire including the tungsten wire as a core wire and an insulator coating the core wire, and
the insulative yarns account for at least 70% of the yarns including the conductive yarn and the insulative yarns.

2. The flexible wiring board according to claim 1,
wherein a color of a first part of the insulative yarns around the conductive yarn is different from a color of a second part of the insulative yarns different from the first part of the insulative yarns.

3. The flexible wiring board according to claim 1,
wherein the flexible wiring board includes the woven fabric, and
the conductive yarn comprises two conductive yarns that are parallel to each other and woven as lengthwise yarns or crosswise yarns constituting the woven fabric.

4. The flexible wiring board according to claim 1,
wherein the flexible wiring board includes the woven fabric, and
the conductive yarn comprises conductive yarns that are woven as lengthwise yarns and crosswise yarns crossing each other, the lengthwise yarns and the crosswise yarns constituting the woven fabric.

5. The flexible wiring board according to claim 3,
wherein a portion of each of the two conductive yarns is cut away, and
the two conductive yarns that are cut are electrically connected via an electronic component disposed in a place in which the portions of the two conductive yarns are cut away.

6. The flexible wiring board according to claim 4,
wherein a portion of each of at least two conductive yarns among the conductive yarns is cut away, and
the at least two conductive yarns that are cut are electrically connected via an electronic component disposed in a place in which the portions of the two conductive yarns are cut away.

7. An electronic device, comprising:
the flexible wiring board according to claim 3; and
a power source and an electrical load that are electrically connected via the flexible wiring board, the electrical load operating with power from the power source,
wherein the power source and the electrical load are electrically connected by the two conductive yarns.

8. The electronic device according to claim 7,
wherein the electrical load comprises a plurality of electrical loads, and
the plurality of electrical loads are connected in parallel by the two conductive yarns.

9. The electronic device according to claim 7,
wherein the electrical load is a light-emitting element.

10. The electronic device according to claim 7,
wherein the electrical load is a sensor.

11. An electronic device, comprising:
the flexible wiring board according to claim 1; and
an electronic element electrically connected to the flexible wiring board.

12. A fiber product including the flexible wiring board according to claim 4 as a cloth, the fiber product comprising a plurality of light-emitting elements disposed in respective cross points of the conductive yarns crossing each other as the lengthwise yarns and the crosswise yarns,
wherein the plurality of light-emitting elements in the respective cross points are electrically connected to, among the conductive yarns, conductive yarns woven as the lengthwise yarns and conductive yarns woven as the crosswise yarns.

13. The flexible wiring board according to claim 1,
wherein the insulative yarns account for at least 90% of the yarns including the conductive yarn and the insulative yarns.

14. The flexible wiring board according to claim 1,
wherein the insulative yarns include natural fibers or chemical fibers.

15. The flexible wiring board according to claim 1,
wherein the woven fabric or the knit fabric includes only two tiers.

16. The flexible wiring board according to claim 1,
wherein a colored portion disposed as a mark on a part of the woven fabric or the knit fabric including the insulative yarns around the conductive yarn.

17. The flexible wiring board according to claim 16,
wherein the colored portion includes a color material including a binder resin and at least one selected from the group consisting of a pigment and a dye.

18. The flexible wiring board according to claim 16,
wherein the colored portion is disposed adjacent to one end of the conductive yarn.

* * * * *